United States Patent [19]

Lou

[11] Patent Number: 4,656,369

[45] Date of Patent: Apr. 7, 1987

[54] RING OSCILLATOR SUBSTRATE BIAS GENERATOR WITH PRECHARGE VOLTAGE FEEDBACK CONTROL

[75] Inventor: Perry W. Lou, Sugar Land, Tex.

[73] Assignee: Texas Instruments Incorporated, Dallas, Tex.

[21] Appl. No.: 651,401

[22] Filed: Sep. 17, 1984

[51] Int. Cl.⁴ .............................. H03B 5/24
[52] U.S. Cl. .................. 307/297; 307/296 R
[58] Field of Search ............ 307/296 R, 297, 304, 307/200 B

[56] References Cited

U.S. PATENT DOCUMENTS

| | | | |
|---|---|---|---|
| 4,307,333 | 12/1981 | Hargrove | 307/297 X |
| 4,322,675 | 3/1982 | Lee et al. | 307/200 B X |
| 4,388,537 | 6/1983 | Kanuma | 307/296 R X |
| 4,438,346 | 3/1984 | Chuang et al. | 307/297 |
| 4,450,515 | 5/1984 | Takemae et al. | 307/297 X |
| 4,503,339 | 3/1985 | Tsuge et al. | 307/304 X |
| 4,547,682 | 10/1985 | Bialas, Jr. et al. | 307/297 |
| 4,581,546 | 4/1986 | Allan | 307/296 R X |

OTHER PUBLICATIONS

Harroun, "Substrate Bias Voltage Control", *IBM T.D.B.*, vol. 22, No. 7, Dec. 1979, pp. 2691-2692.

*Primary Examiner*—Stanley D. Miller
*Assistant Examiner*—D. R. Hudspeth
*Attorney, Agent, or Firm*—John G. Graham; Rodney M. Anderson

[57] ABSTRACT

A generator circuit for producing a negative bias voltage on a substrate for a semiconductor device employs a multistage on-chip oscillator driving individul charge pump circuits for each stage. The oscillator may produce a frequency related to the value of the negative bias, using a feedback circuit. Each of the charge pump circuits includes a capacitor and an MOS diode coupled to the substrate and another diode coupled to the ground terminal of the supply.

15 Claims, 9 Drawing Figures

RING OSCILLATOR SUBSTRATE BIAS GENERATOR WITH PRECHARGE VOLTAGE FEEDBACK CONTROL

BACKGROUND OF THE INVENTION

This invention relates to semiconductor devices, and more particularly to substrate bias generator circuits for VLSI semiconductor integrated circuits such as microprocessor or memory devices or the like.

Substrate bias generator circuits for MOS LSI devices have been constructed as shown for example in U.S. Pat. No. 4,115,710, issued to Perry W. Lou, or U.S. Pat. No. 4,494,223, issued Jan. 15, 1985 to G. R. M. Rao and C. N. Reddy, assigned to Texas Instruments. The very high density devices such as high-level microprocessors or dynamic RAMs now being designed have more stringent requirements, however. The regulation, and power dissipation during both operating and standby modes, are more critical.

It is the principal object of this invention to provide an improved substrate bias generator circuit for a semiconductor device such as microprocessor. Another object is to provide a charge pump circuit that is more efficient and operates faster. Another object is to provide a substrate bias generator that reduces operating and standby power dissipation.

SUMMARY OF THE INVENTION

In accordance with one embodiment of the invention, a generator circuit for producing a negative bias voltage on a substrate for a semiconductor device employs a multistage on-chip oscillator driving individual charge pump circuits for each stage. The oscillator may produce a frequency related to the value of the negative bias, using a feedback circuit. Each of the charge pump circuits includes a capacitor and an MOS diode coupled to the substrate and another diode coupled to the ground terminal of the supply.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
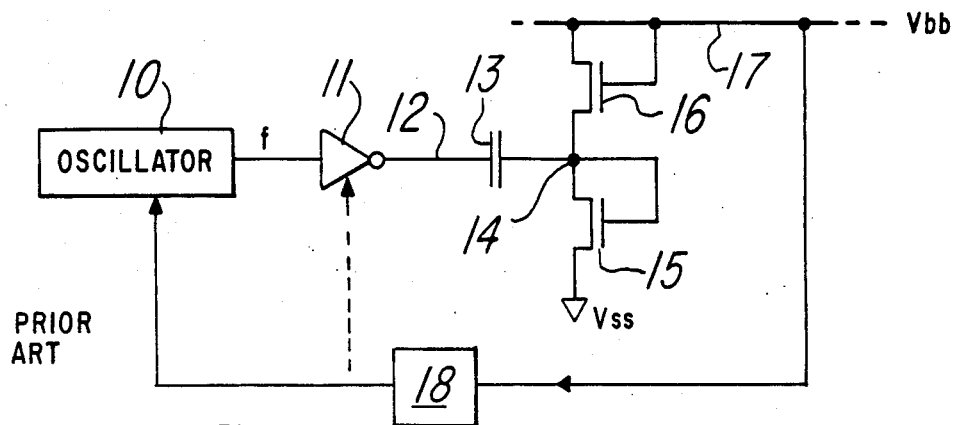
FIG. 1 is an electrical schematic diagram of a substrate bias generator circuit of the prior art.

A common substrate pump configuration as shown in FIG. 1 consists of an oscillator 10, an inverter driver stage 11 with output node 12, and a pump capacitor 13 with pump node 14 and transistors 15 and 16 connected as MOS diodes; this circuit drives a substrate node 17 to a voltage $-V_{bb}$. Substrate voltage sensing circuits 18 are sometimes used to control the oscillator 10 or the drive stage 11 in order to regulate the substrate voltage $-V_{bb}$ on the substrate 16.

Figure 2:
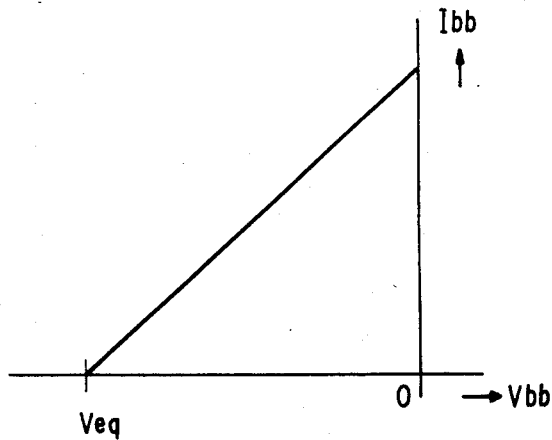
FIGS. 2, 3, and 4 are plots of current vs. voltage current in operation of the circuit of FIG. 1.

The output of a substrate pump as that of FIG. 1 may generally be characterized by a Thevenin equivalent resistance and voltage supply. The equivalent resistance is approximately $R_{eq} \approx 1(2\pi fC)$, where C is the value of the pump capacitor 13, and f is the frequency of oscillator 10. The equivalent voltage source has a value equal to the maximum voltage available to charge the substrate 17. In the common configuration of FIG. 1, this voltage is $V_{eq} \approx -(V_{cc} - V_{t1} - V_{t2})$, where $V_{t1}$ is the threshold voltage transistor 15 and is variable depending on the value of substrate voltage $-V_{bb}$, and $V_{t2}$ is the threshold of transistor 16 and is constant since transistor 17 operates with $V_{bs}=0$. Assuming a constant frequency of oscillator 10, the pump of FIG. 1 has the output characteristic shown in FIG. 2. If the entire circuit on the chip drew no substrate current, the simple, unregulated pump would eventually produce $V_{bb} \approx V_{eq}$.

Figure 3:
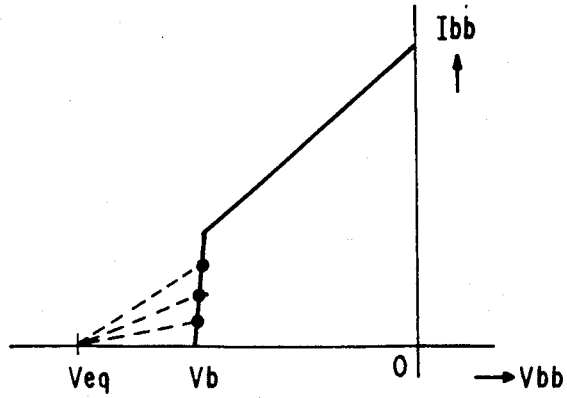

Sensing circuits 18 seek to regulate $-V_{bb}$ to some value $V_b$ less than $V_{eq}$. This is usually accomplished by reducing the frequency of oscillator 10, thereby increasing $R_{eq}$, when $V_{bb}$ is near $V_b$, as seen in FIG. 3.

Figure 4:
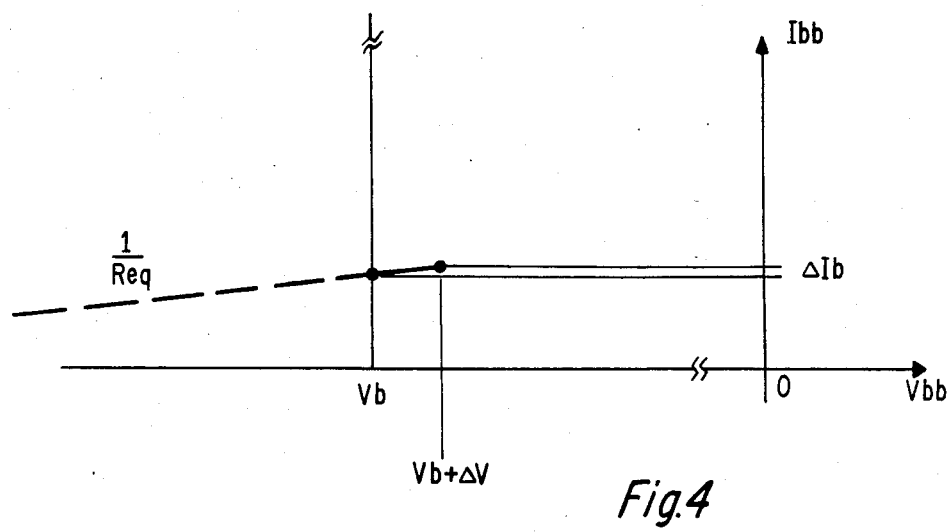

Referring to FIG. 4, a shortcoming of this system occurs when the pump circuit of FIG. 1 is regulating at a high value of output impedance, $R_{eq}$; normal circuit operation elsewhere on the bar can cause rapid changes $\Delta V$ in the substrate voltage from capacitive coupling. Because of delays in the substrate voltage sensing circuit 18, and because the frequency of oscillator 10 won't respond instantaneously, the high value output impedance also doesn't change immediately. The pump is therefore unable to supply very much correcting current, $\Delta I_b$, until the sensing circuit and oscillator respond.

An additional characteristic of the common pump configuration of FIG. 1 is that the frequency of oscillator 10 is not related to the charge or discharge rate of the pump capacitor 13. The circuit designer must design the drive stage 11 and MOS diodes 15 and 16 to charge and discharge (or pump) the pump capacitor 13 within the period of oscillation. The worst case occurs at power-up when the pump is just started, and $V_{bb}=0$. The drive stage 11 and MOS diodes 15 and 16 must charge and pump the maximum amount of charge $q = C \times V_{eq}$ within the period of oscillation, where C is the capacitance of the pump capacitor 13. However, once the system reaches the regulation point, much less charge is required per cycle. The drive stage 11 is then idle for a portion of the cycle after the required charging or pumping has been done.

Figure 5:
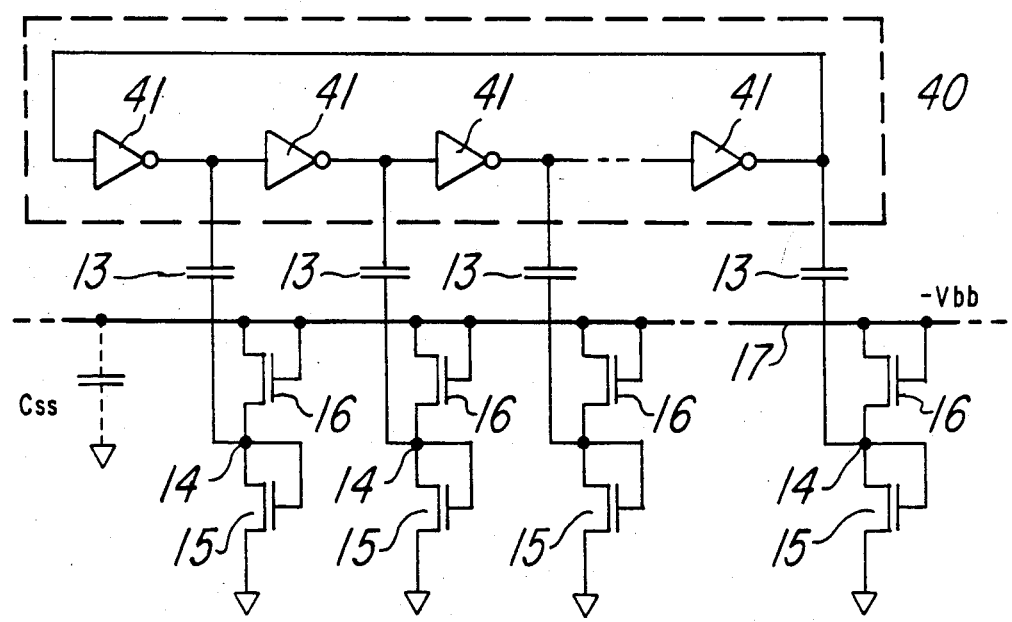
FIG. 5 is an electrical schematic diagram of a substrate bias generator circuit according to the invention.

According to the invention, the circuit of FIG. 5 employs a ring oscillator 40 having an odd number of stages 41, and distributes the pump capacitor 13 between each stage of the ring oscillator. Each stage 41 of the oscillator 40 thus acts as both a drive stage 11 (of FIG. 1) and as a portion of the oscillator. The delay per stage now consists of the pump capacitor 13 in series with the MOS diodes 15, 16 and substrate capacitance $C_{ss}$, driven by the output impedance of the stage inverter 41. As is usual for ring oscillator design, a sufficiently large number of stages must be used so that each stage has time to make full transitions up and down.

Figure 6:
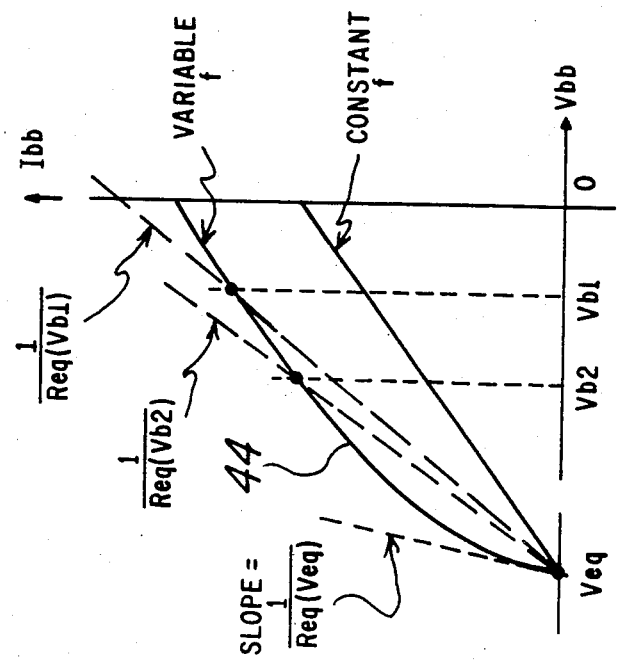
FIG. 6 is a plot of current vs. voltage in operation of the circut of FIG. 5.

Referring to FIG. 6, the curved line 44 depicts the effect of varying frequency as the substrate 17 gets pumped up. If the sum of the distributed pump capacitors 13 of FIG. 5 is the same as the single pump capacitor 13 in the common design of FIG. 1, the initial current (at Vbb=0) is likely to be greater in the ring oscillator configuration of FIG. 5 because the frequency will probably be higher. The tangent to the curve 44 at Veq. shows the lower pump impedance at that point.

Given that the higher frequency at the point of regulation is desirable, then regulation of Vbb to Vb<Veq must be accomplished not by oscillator control, but by control of 'Veq', the voltage available to the substrate. This may be accomplished by limiting the precharge voltage on the pump capacitor 13, or limiting the voltage swing on node 12 available during the pumping stroke. Generally, such controls should not be done at the driven end of the pump capacitor, as this might interfere with clean operation of the ring oscillator 40. In the preferred embodiment, seen in FIG. 7, an MOS transistor 45 is used as a variable resistance to control precharge voltage. The sense circuit 18 is such that when −Vbb is less than the desired value, the control line 46 is high, allowing full precharge voltage on the pump capacitor 13. As the substrate 17 approaches the desired value −Vbb, the control line 46 goes low, increasing the MOS variable resistance of the transistor 45 for each stage, and effectively limiting the precharge voltage by increasing the charging time constant. As the precharge voltage is limited, the frequency still increases, giving the desired low impedance output at regulation, as illustrated in FIG. 8.

The results of this configuration are that the frequency f of oscillator 10 is always optimal for the amount of charge pumping required, and for any process, voltage, or temperature variation. Actually, the instantaneous level of efficiency of the pump mechanism controls the oscillation frequency, instead of having the oscillation frequency be independent of pump efficiency as in prior designs.

Of particular interest is the characteristic that as the substrate voltage approaches its "final value" (i.e., Veq. for an unregulated pump, or Vb for a regulated pump) and progressively less charge is required to be pumped per cycle, the oscillation frequency increases. This is because the MOS diode 16 connected to Vbb node 17 is conducting for shorter amounts of time, so that the pump capacitors 13 are not connected to the substrate capacitance for most of the time. The delay per stage is thus decreased, as the capacitive loading reduces to being the pump capacitor 13 in series with only the relatively small node capacitance at the junction 14 of the two MOS diodes 15 and 16. The equivalent output impedance at the point of regulation is therefore lower, since the frequency is higher, so that the instantaneous current response to a voltage disturbance is now much better.

Figure 7:
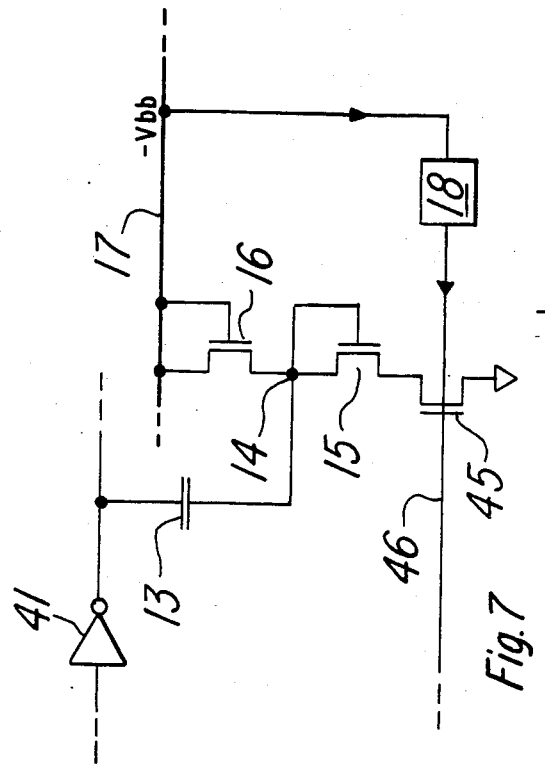
FIG. 7 is an electrical schematic diagram of one of the stages in the circuit of FIG. 5.
Figure 8:
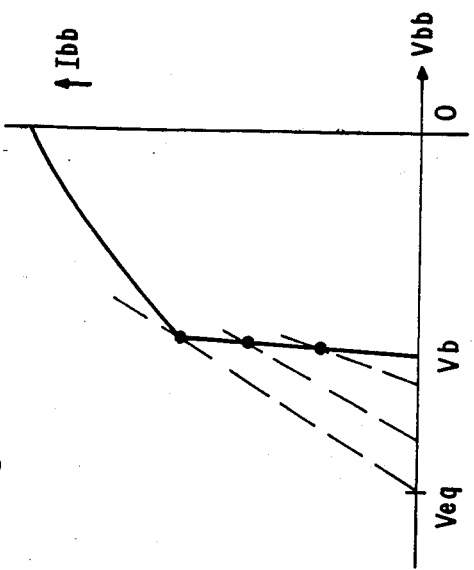
FIG. 8 is a plot of current vs. voltage in operation of the circuit of FIGS. 5 and 7.

Another improved characteristic of a ring-organized substrate pump as in FIGS. 5 and 7 is that substrate current Ibb is delivered in a "smoother" manner than the single-capacitor pump of FIG. 1. The Ibb may be delivered in n number of smaller charge packets per oscillation cycle (where n is the number of ring oscillator stages of FIG. 5), instead one large charge delivery per cycle in the prior design of FIG. 1. The smaller amplitude, higher frequency pump cycles of the ring design of FIG. 5 are filtered by the substrate capacitance Css better than the single stroke, larger amplitude, lower frequency pumping of the prior design. The result is a significantly lower noise contribution to substrate voltage from the ring organized substrate pump.

The concept of the invention may be adapted to either N-channel or P-channel MOS charge pumps, and other common charge pump improvements such as tripling circuits and improved drive techniques, as in copending application Ser. No. 651,140, filed herewith, may be used in conjunction with the disclosed configuration.

Figure 9:
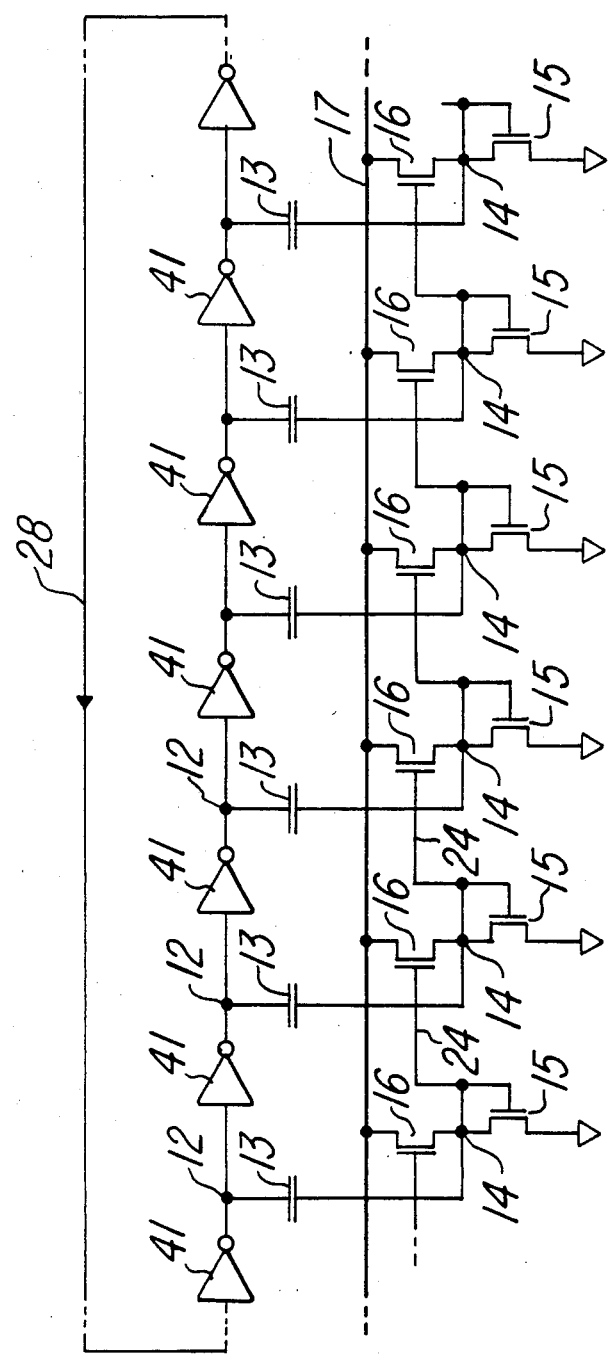

For example, FIG. 9 shows substrate pump circuits as in my application Ser. No. 651,140, similar to FIG. 5 described above, but having the gate of the transistor 16 in each pump stage coupled to the node 14 in the prior stage by a line 24; that is, each transistor 16 has the complement pump signal on its gate. This allows transfer of more charge from the pumping capacitor 13 to the substrate 17 on each pump cycle. Also, the pumped charge is delivered directly to the substrate through ohmic connections, rather than through forward biased injecting junctions. The regulator transistor 45 of FIG. 7 may be included in each stage of FIG. 9.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A substrate bias generator circuit comprising:
   an oscillator having a plurality of stages,
   a plurality of charge pump circuits, each charge pump circuit including a capacitor and a pair of MOS transistors connected as diodes, each charge pump circuit having an input separately coupled to receive the output of one stage of said oscillator, and having an output coupled to the substrate, and
   means for controlling the voltage to which said capacitor is charged.

2. A circuit according to claim 1 wherein said capacitor is connected on one side to the output of its associated stage of said oscillator, and where one of said MOS transistors selectively couples the other side of said capacitor to a ground terminal.

3. A substrate bias generator circuit comprising:
   an oscillator having a plurality of stages, and
   a plurality of charge pump circuits, each charge pump circuit including a capacitor and a pair of MOS transistors connected as diodes, each charge pump circuit having an input separately coupled to receive the output of one stage of said oscillator, and having an output coupled to the substrate,
   and wherein said capacitor is connected on one side to the output of its associated stage of said oscillator, and wherein one of said MOS transistors selectively couples the other side of said capacitor to a ground terminal through a voltage-responsive transistor controlled by feedback from the substrate.

4. A substrate bias pumping circuit for a semiconductor device constructed on a semiconductor substrate, comprising:
   (a) an oscillator having a plurality of inverter stages, each stage having an output,
   (b) a plurality of pump circuits, each having an output coupled to the substrate, each of the pump circuits receiving separately one of said outputs from one of the stages of said oscillator, (c) and control means responsive to the voltage of said substrate to control an impedance in each of said pump circuits in such a manner that the amount of charge pumped by the circuit from said substrate is responsive to the voltage of said substrate.

5. A circuit according to claim 4 wherein said control means includes means for detecting the substrate bias and said impedances of the pump circuits alter the frequency of the oscillator.

6. A circuit according to claim 4 wherein said control means includes means for detecting the substrate bias.

7. A circuit according to claim 6 wherein said pump circuits each comprise:

(a) a capacitor having one side connected to the output of its associated stage of said oscillator, (b) a first diode having its cathode connected to the other side of said capacitor and having its anode coupled to the substrate, and (c) a second diode having its cathode coupled to a ground terminal and having its anode also connected to the other side of said capacitor, and wherein said impedance is connected in series with said second diode between its connection to the other side of said capacitor and said ground terminal, and wherein said control means controls said impedance in such a manner that the voltage to which said capacitor is charged during the operation of said pump circuit is reduced as the bias of the substrate approaches its desired value.

8. A circuit according to claim 7 wherein said first and second diodes are MOS transistors connected as diodes.

9. A circuit according to claim 7 wherein said impedance is an MOS transistor operating as a variable resistor.

10. A circuit according to claim 8 wherein said impedance is an MOS transistor operating as a variable resistor.

11. A substrate bias generator circuit comprising:
an oscillator having at least three stages,
a plurality of charge pump circuits, numbering at least three but no more than the number of stages of said oscillator, each charge pump circuit having an input separately coupled to receive the output of one stage of said oscillator, and having an output coupled to the substrate.

12. A circuit according to claim 11 wherein each said charge pump circuit includes a capacitor and a pair of MOS transistors connected as diodes.

13. A circuit according to claim 12 including means, responsive to the substrate bias, for controlling the voltage to which the capacitor is charged during the operation of the charge pump circuit.

14. A circuit according to claim 13 wherein the capacitor is connected on one side to the output of its associated stage of said oscillator and wherein one of said MOS transistors selectively connects the other side of said capacitor to a ground terminal.

15. A circuit according to claim 14 wherein said controlling means is a voltage-responsive transistor controlled by feedback from the substrate, and wherein said one of the MOS transistors is coupled to said ground terminal through said voltage-responsive transistor.

* * * * *